United States Patent [19]

Egawa et al.

[11] Patent Number: 4,713,354

[45] Date of Patent: Dec. 15, 1987

[54] METHOD OF HEAT TREATMENT FOR REDUCTION OF DISLOCATION DENSITY NEAR III-V SUBSTRATE SURFACE

[75] Inventors: Takashi Egawa; Yoshiaki Sano, both of Tokyo, Japan

[73] Assignee: Oki Electric Industry Co., Ltd., Tokyo, Japan

[21] Appl. No.: 834,363

[22] Filed: Feb. 28, 1986

[30] Foreign Application Priority Data

Feb. 28, 1985 [JP] Japan .................................. 60-40130

[51] Int. Cl.⁴ .................. H01L 21/265; H01L 21/322
[52] U.S. Cl. ..................................... 437/22; 437/247; 437/939; 437/949; 437/19; 437/912
[58] Field of Search ............... 148/1.5, 187; 29/576 B, 29/576 T

[56] References Cited

U.S. PATENT DOCUMENTS

| 4,312,681 | 1/1982 | Rupprecht et al. | 148/1.5 |
| 4,357,180 | 11/1982 | Molnar | 148/1.5 |
| 4,421,577 | 12/1983 | Spicer | 148/187 |
| 4,576,652 | 3/1986 | Hovel et al. | 148/1.5 |
| 4,595,423 | 6/1986 | Miyazawa et al. | 148/1.5 |

FOREIGN PATENT DOCUMENTS

| 0169020 | 1/1986 | European Pat. Off. | 148/DIG. 84 |
| 0007715 | 1/1985 | Japan | 148/DIG. 84 |
| 0047428 | 3/1985 | Japan | 148/DIG. 84 |
| 0039826 | 3/1985 | Japan | 148/DIG. 84 |

OTHER PUBLICATIONS

Lee et al., in Ion Implantation in Semiconductors, 1976, ed. Chernow et al., Plenum, N.Y., p. 115.
Yasunobu Ishii, "Threshold Voltage Scattering of GaAs MESFET's Fabricated on LEC-Grown Semi--Insulating Substrates, IEEE Transactions on Electron Devices, vpl. Ed.-31, No. 6, Jun. 1984, pp. 800-804.

Primary Examiner—Upendra Roy
Attorney, Agent, or Firm—Wenderoth, Lind & Ponack

[57] ABSTRACT

In a method of manufacturing semiconductor devices wherein a III-V compound semiconductor substrate is annealed in gas atmosphere of which the gas includes an element constituting the III-V compound semiconductor substrate to reduce the dislocation density near the III-V compound semiconductor substrate surface.

4 Claims, 15 Drawing Figures

○ S<−7%   ○ −7%≦S<−5%   ○ −5%≦S<−3%
∘ −3%≦S<−1%   · −1%≦S<1%   · 1%≦S<3%
• 3%≦S<5%   • 5%≦S<7%   • 7%≦S

○ S<−7%         ○ −7%≦S<−5%      ○ −5%≦S<−3%

∘ −3%≦S<−1%    · −1%≦S<1%        · 1%≦S<3%

● 3%≦S<5%      ● 5%≦S<7%         ● 7%≦S

METHOD OF HEAT TREATMENT FOR REDUCTION OF DISLOCATION DENSITY NEAR III-V SUBSTRATE SURFACE

BACKGROUND OF THE INVENTION

1. Field of the Invention

The present invention relates to a method of manufacturing semiconductor devices, and more particularly to a method of heat treating a III-V substrate such as a GaAs substrate to reduce the dislocation density near the III-V substrate surface.

2. Description of the Related Art

Recently, III-V compound semiconductor devices have been developed for high speed and low power dissipation devices. For example, a GaAs metal-semiconductor field-effect transistor (MESFET), a GaAs light emitting diode (LED), a GaAs semiconductor LASER and so forth have been put to practical use.

In manufacturing these devices, active elements are made by using a semiconductor substrate or an epitaxial layer which is deposited on the substrate by the method of metal organic chemical Vapour Deposition (MOCVD), molecular beam epitaxy (MBE) or liquid phase epitaxy (LPE). However, in all cases, there is dislocation in the substrates so that the threshold voltage standard deviation ($\sigma$ Vth) of the devices such as MESFET's are influenced and deteriorated.

Thus, the substrates having no dislocation or a little dislocation are expected. The threshold voltage standard deviation ($\sigma$ Vth) for MESFET's on a liquid encapsulated Czochralski (LEC) grown GaAs substrate, which is annealed in an $N_2$ atmosphere is reported by Yasunobu Ishii, et al in IEEE Transactions on Electron Devices, Vol. ED-31, No. 6, June 1984, pages 800-804.

In the report, the dislocation density is investigated as etch pit density (hereinafter referred to as "EPD"). As shown in FIG. 1, the commercially available LEC-grown undoped semi-insulating GaAs substrates show a typical W-shaped distribution of EPD. The threshold voltage (hereinafter referred to as "Vth") of MESFET's fabricated on these substrates show an M-shaped distribution corresponding to the W-shaped EPD distribution.

In fabricating the MESFET's on commercially available LEC-grown undoped semi-insulating GaAs substrates as mentioned before, the GaAs substrates are annealed in an $N_2$ atmosphere so that the dislocation density near the GaAs substrate surface cannot be decreased and the uniform Vth distribution cannot be obtained.

Further in fabricating GaAs LED's or GaAs semiconductor LASER's, a high pure epitaxial layer deposited on the substrate by the method of MOCVD, MBE or vapor phase epitaxy (VPE) using a halide is influenced by the dislocation in the substrate so that the semiconductor devices are short-lived or cannot be fabricated with high yield. Accordingly it is necessary to deposit the epitaxial layer on an expensive substrate with low dislocation density so that there is a problem that the semiconductor devices cost too much.

BRIEF SUMMARY OF THE INVENTION

The present invention has been made in view of the above-mentioned various disadvantages inherent in the conventionally known LEC-grown undoped semi-insulating GaAs substrates and the like.

It is a primary object of this invention to provide a method of manufacturing semiconductor devices.

It is still another object of this invention to provide a method of heat treatment for the reduction of the dislocation density near a III-V substrate surface.

It is a further object of this invention to provide a method of heat treatment to make uniform the Vth distribution.

These and other objects are accomplished by heat treating a III-V compound semiconductor substrate in a gas atmosphere which includes an element constituting said III-V compound semiconductor substrate to reduce the dislocation density near the III-V compound semiconductor substrate surface, in a method of manufacturing semiconductor devices.

BRIEF DESCRIPTION OF THE DRAWINGS

The objects and features of the invention may be understood with reference to the following detailed description of an illustrative embodiment of the invention, taken together with the accompanying drawings in which:

FIGS. 5(A) and 4(B) are Vth distribution maps of FESFET's fabricated on the wafers.

DESCRIPTION OF THE PREFERRED EMBODIMENT

In this preferred embodiment, methods of fabricating III-V compound semiconductor devices are described using commercially available undoped LEC(100) GaAs wafers (Dislocation density; $10^4$-$10^5$ cm$^{-2}$).

Figure 1:
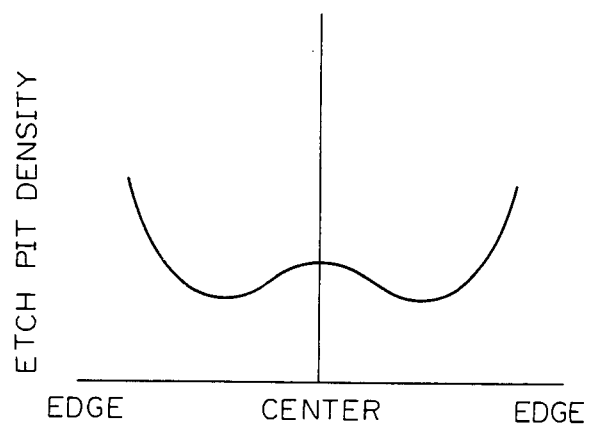
FIG. 1 is a diagram showing the relationship between the diameter direction and the EPD of MESFET's fabricated on conventional wafers.
Figure 2A:
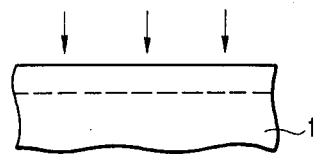
FIGS. 2(A) to 2(F) are sectional views showing the steps of manufacturing a MESFET according to the present invention.

Referring now to the drawings, FIG. 2(A) illustrates a GaAs wafer 1 in which the $^{29}$Si+ ions have been implanted at an energy of 60 KeV with a dosage of $1.4 \times 10^{12}$ cm$^{-2}$ to obtain an n channel 2.

Figure 2B:
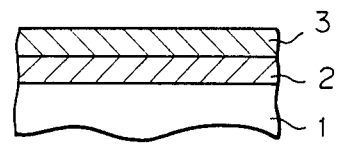

In FIG. 2(B), the n channel 2 is obtained by annealing the GaAs wafer 1 at 800° C. in an As atmosphere for about 20 minutes with a $SiO_2$ capping-film 3 as a surface protecting layer deposited at 1000 Å thick by a chemical vapor deposition method (hereinafter referred to as "CVD") at 380° C.

Figure 2C:
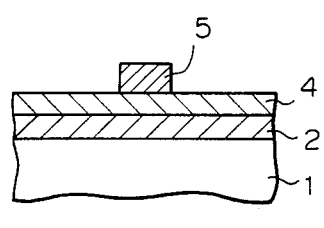

After the CVD $SiO_2$ capping-film 3 is removed, a W-Al film 4 about 1000 Å thick is deposited by sputtering on the entire surface of the GaAs wafer 1, and a Ti/Ni mask 5 about 3000 Å thick is made on the W-Al film 4 by a lift-off method as shown in FIG. 2(c).

Figure 2D:
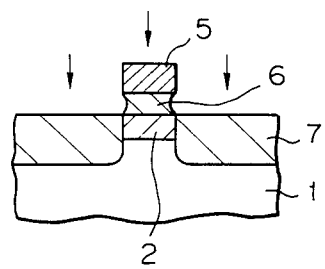

After a W-Al gate electrode 6 is formed by etching the W-Al film 4 using the Ti/Ni mask 5, as shown in FIG. 2(D), n+ regions 7 are obtained by Si implantation at an energy of 100 KeV with a dosage of $1.5 \times 10^{13}$ cm$^{-2}$ by using the Ti/Ni mask 5.

Figure 2E:
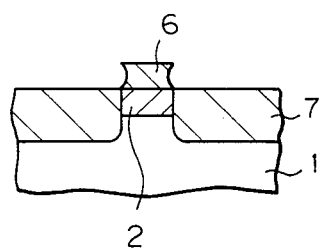

After the Ti/Ni mask 5 is removed, as shown in FIG. 2(E), annealing is carried out at 800° C. for about 20 minutes in an As atmosphere to activate the n+ regions 7.

Figure 2F:
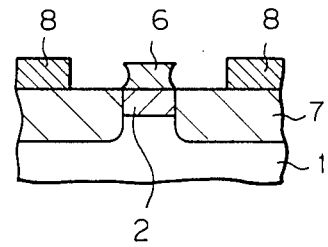

As shown in FIG. 2(F), ohmic electrodes 8 of AuGe/Ni/Au are formed on the n+ regions 7 as source and drain electrodes and a GaAs MESFET is obtained.

We examined the availability of the annealing method by comparing the Vth scattering of the MESFET's as mentioned before with that of MESFET's fabricated on a wafer annealed in a non-As atmosphere.

Figure 3A:
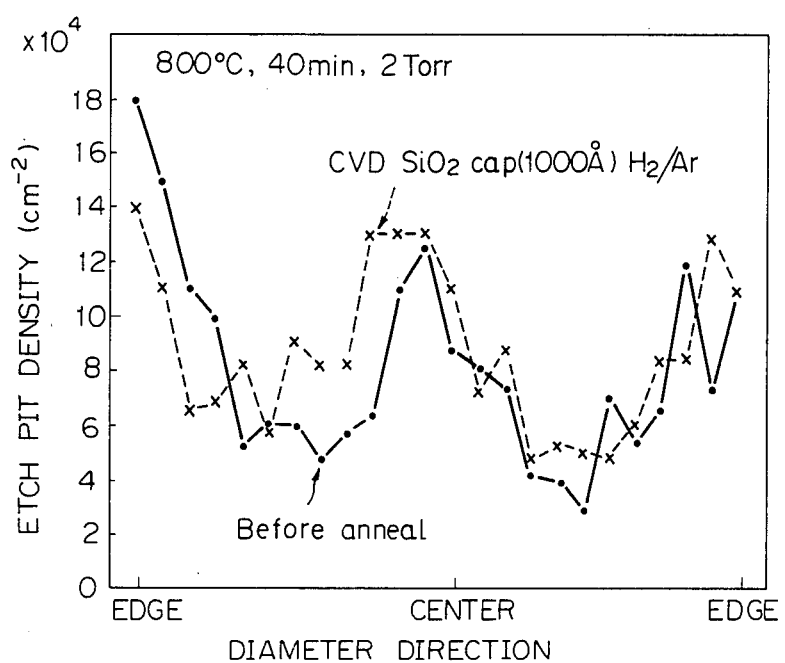
FIGS. 3(A) and 3(B) are graphical representations showing the relationship between the diameter direction on the X-axis and EPD on the Y-axis.
Figure 3B:
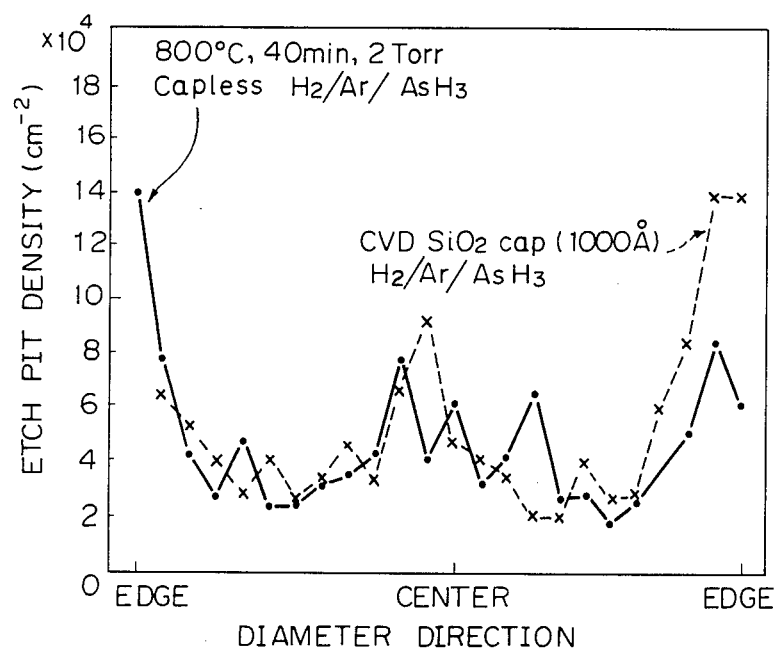

FIGS. 3(A) and 3(B) are graphical representations showing the relationship between the diameter direction on the X-axis and the distribution of EPD as dislocation density in a (011) direction on the Y-axis. Respectively, the annealings of undoped LEC wafers are carried out at 800° C. for about 40 minutes in As or in a non-As atmosphere with or without a CVD $SiO_2$ capping-film, and the surface of the wafer are etched at about 3 μm thickness by molten KOH at 350° C., then the EPD is measured.

As shown in FIG. 3(A), the EPD distribution (indicated by a broken line) of the wafer annealed with a $SiO_2$ capping-film 1000 Å thick in an $H_2/Ar$ atmosphere is W-shaped and isn't improved as compared with the EPD distribution of the nonannealed wafer (indicated by a solid line).

As shown in FIG. 3(B), however, the EPD of the wafer annealed in an $H_2/Ar/AsH_3$ atmosphere is ($PAsH_3 = 2$ Torr) decreased, especially at the central region. The EPD distribution become uniform as compared with that of the wafer non-annealed wafer (indicated by a broken line) or without (indicated by a solid line) a surface protecting layer.

Figure 4:
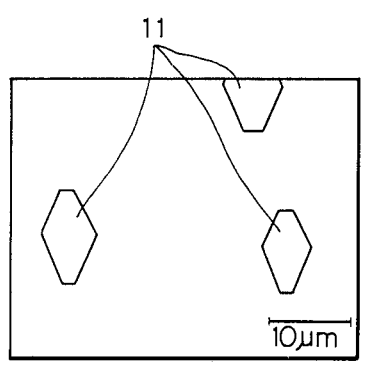
FIGS. 4(A) to 4(D) are enlarged schematic representations copied from micro-photographs of the wafers of which a surface 3 $\mu$m thick is etched.
Figure 4:
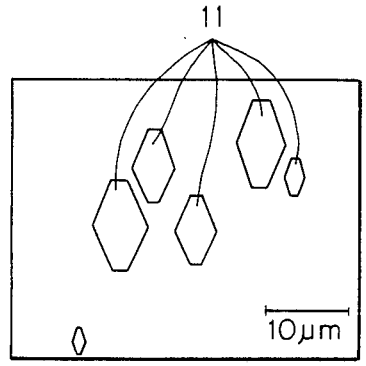
Figure 4:
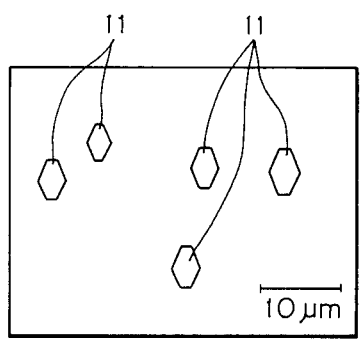
Figure 4:
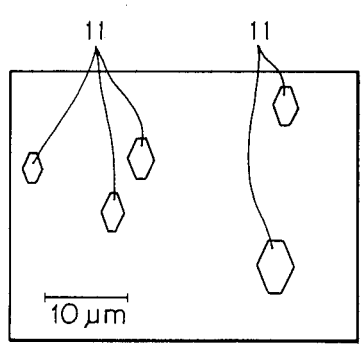

FIGS. 4(A) to 4(D) are enlarged schematic representations copied from micro-photographs of a wafers of which the surface of 3 μm thick is etched. FIG. 4(A) indicates the aspect of a nonannealed wafer, FIG. 4(B) indicated the aspect of a wafer which is annealed with a $SiO_2$ capping-film 1000 Å thick in an $H_2/Ar$ atmosphere, FIG. 4(C) indicates the aspect of a wafer which is annealed without a capping-film in an $H_2/Ar/AsH_3$ atmosphere, FIG. 4(D) indicates the aspect of a wafer which is annealed with a $SiO_2$ capping-film in an $H_2/Ar/AsH_3$ atmosphere.

The etch pits 11 shown in FIGS. 4(C) and 4(D) are below the half size of the etch pits shown in FIG. 4(A). The size of the etch pits 11 shown in FIGS. 4(A) are nearly equal to that of the etch pits 11 shown in FIG. 4(B). As evidenced in these FIGS. 4(A) to 4(D), the EPD is reduced by annealing in an As atmosphere and the wafers are effected about 5 μm deep.

As evidenced in the foregoing description, the GaAs wafers are annealed in an As atmosphere without or with a surface protecting layer which can introduce an As vapor pressure to wafers (for example, a $SiO_2$ capping-film is deposited by a CVD method at 380° C.) so that the EPD can be reduced and the EPD distribution can be uniformed. In fabricating MESFET's using annealed wafers, the Vth distribution can be uniformed. Further, the EPD of an epitaxial layer deposited on these annealed wafers can be reduced and distributed uniformly.

Figure 5A:
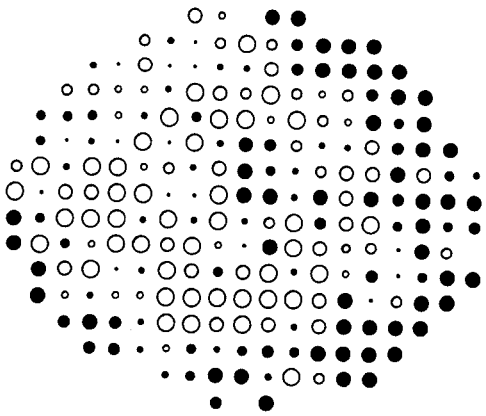
Figure 5B:
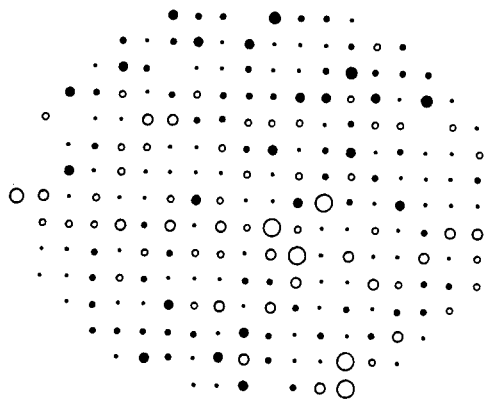

FIGS. 5(A) and 5(B) show Vth distribution maps of MESFET's fabricated on the wafers which is annealed without [FIG. 5(A)] and with [FIG. 5(B)] introducing As vapor pressure to the wafers, respectively. In these FIGS. 5(A) and 5(B), the scales are divided into 9 grades and are shown by different sizes of open and filled circles. The larger open circle is used as Vth shifts towards the positive direction, while the larger filled circle is used as Vth shifts towards the negative direction. The normalized parameter (S) was defined as $$S = \frac{\sigma\ Vth}{|-0.75 + \overline{Vth}|} \times 100$$

As shown in FIG. 5(A), the largest scattering parameter S is 10.1% and the so-called W-shaped Vth distribution was clearly recognized. As shown in FIG. 5(B), on the contrary, the smallest S obtained was 2.6% and high uniformity was obtained over the full wafer and a W-shaped Vth distribution was not recognized. Thus by annealing in an As atmosphere, the EPD is reduced and distributed uniformly, so that the Vth distribution of MESFET's is improved.

It is evident this invention is not to be restricted within the embodiment as mentioned before.

For example, annealings may be carried out under the conditions shown in table I (No. 2). Annealing is carried out at more than 700° C. in an As atmosphere ($PAsH_3 = 2$ Torr) with a CVD $SiO_2$ capping-film 1000 Å thick deposited on the GaAs wafer 1 before the ion implantation to obtain the n channel 2, subsequently GaAs MESFET's may be fabricated by going through the processes shown in FIGS. 2(A)-(F). By carrying out the annealing before ion implantation, the MESFET's having more uniform Vth distribution can be obtained (as shown in the table I).

TABLE I

| | Annealing Process | | | | | |
|---|---|---|---|---|---|---|
| | Before ion implantation | To obtain n channel | To obtain n+ regions | Vth (mV) | Vth (mV) | S (%) |
| 1 | No | With CVD $SiO_2$ film 1000 Å thick $PAsH_3 = 2$ Torr | Without film $PAsH_3 = 2$ Torr | 97.5 | 23.2 | 3.7 |
| 2 | With CVD $SiO_2$ film 1000 Å thick $PAsH_3 = 2$ Torr | With CVD $SiO_2$ film 1000 Å thick $PAsH_3 = 2$ Torr | Without film $PAsH_3 = 2$ Torr | 82.0 | 15.6 | 2.3 |

Thus, this EPD reduction technique is very promising for applying to not only the post-implantation annealing but to the preheat treatment of the substrate for the device fabrication and the epitaxial growth.

In the preferred embodiment as mentioned before, the method of heat treatment in an As atmosphere (as in a gas atmosphere which includes an element constituting the GaAs wafer) is mentioned, however the same effect can be expected even if the heat treatment is carried out in a Ga atmosphere.

Further, other III=V compound semiconductor substrates are applicable to this invention and the gas atmosphere in which the substrates are annealed can apply to another gas atmosphere which includes an element constituting the III-V compound semiconductor substrate.

As evidenced in the foregoing description, the invention provides the following advantages. According to the invention, MESFET's with a uniform distribution of Vth can be fabricated easily at a high yield. Further, not only MESFET's, but LED's and semiconductor LASER's can be fabricated with high yield because the method according to this invention can reduce the EPD of substrates and make uniform the EPD distribution.

What is claimed is:

1. In a method of manufacturing semiconductor devices, which comprises producing III-V compound semiconductor substrates without dislocation density near the III-V compound semiconductor substrate surface, comprising the steps of:
   heat treating said III-V compound semiconductor substrate in a gas atmosphere which includes an element constitute said III-V compound semiconductor substrate; and
   implanting ions for active regions after said heat-treating step.

2. The method of claim 1 wherein said III-V compound semiconductor substrate is a gallium arsenide semiconductor substrate, and said gas atmosphere is an arsenic atmosphere.

3. In a method of manufacturing semiconductor devices which comprises producing III-V compound semiconductor substrates without dislocation density near the III-V compound semiconductor substrate surface, comprising the steps of:
   forming a surface protecting layer on said III-V compound semiconductor substrate;
   heat treating said III-V compound semiconductor substrate in a gas atmosphere which includes an element constituting said III-V compound semiconductor substrate;
   removing said surface protecting layer; and
   implanting ions for active regions after said removing step.

4. The method of claim 3 wherein said III-V compound substrate is a gallium arsenide semiconductor substrate, and said gas atmosphere is an arsenic atmosphere.

* * * * *